US 7,333,539 B2
Feb. 19, 2008

(12) United States Patent
Glendenning

(54) HIGH ORDER FILTERS WITH CONTROLLABLE DELAY AND PERFORMANCE

(75) Inventor: Paul William Glendenning, New South Wales (AU)

(73) Assignee: Deqx Pty Ltd, New South Wales (AU)

( * ) Notice: Subject to any disclaimer, the term of this patent is extended or adjusted under 35 U.S.C. 154(b) by 746 days.

(21) Appl. No.: 10/275,508

(22) PCT Filed: May 4, 2001

(86) PCT No.: PCT/AU01/00514

§ 371 (c)(1),
(2), (4) Date: Jul. 28, 2003

(87) PCT Pub. No.: WO01/86808

PCT Pub. Date: Nov. 15, 2001

(65) Prior Publication Data

US 2004/0101039 A1    May 27, 2004

(30) Foreign Application Priority Data

May 5, 2000    (AU) .................................... PQ7321

(51) Int. Cl.
*H03K 5/159* (2006.01)
*H03H 7/30* (2006.01)

(52) U.S. Cl. ............... 375/232; 375/233; 375/234; 375/350; 708/420; 708/322

(58) Field of Classification Search ............... 375/229, 375/230, 232
See application file for complete search history.

(56) References Cited

U.S. PATENT DOCUMENTS

| 4,992,967 | A | | 2/1991 | Auvray | |
|---|---|---|---|---|---|
| 5,159,565 | A | * | 10/1992 | Bune | 708/319 |
| 5,168,375 | A | * | 12/1992 | Reisch et al. | 382/250 |
| 5,502,747 | A | | 3/1996 | McGrath | |
| 5,809,058 | A | * | 9/1998 | Sato | 375/148 |
| 6,272,173 | B1 | | 8/2001 | Hatamian | |
| 6,693,984 | B1 | * | 2/2004 | Andre | 375/350 |
| 2002/0013798 | A1 | * | 1/2002 | Wilson et al. | 708/319 |
| 2003/0076950 | A1 | * | 4/2003 | Usman et al. | 379/406.08 |

(Continued)

OTHER PUBLICATIONS

Naofal Al-Dhahir, John Cioffi, "Fast Computation of Channel-Estimate Based Equalizers in Packet Data Transmission" IEEE Transactions on Signal Processing, vol. 43, No. 11. Nov. 1995.*

(Continued)

*Primary Examiner*—Chieh M. Fan
*Assistant Examiner*—Aris Fotakis
(74) *Attorney, Agent, or Firm*—Brinks Hofer Gilson & Lione

(57) ABSTRACT

A digital filter is disclosed, the filter comprising a device for determining the initial condition of a partial filter input, using a partitioned filter input signal, and partitioned filter input coefficients and a device for determining the initial condition of a partial filter output, using a partitioned filter output signal, and partitioned filter output coefficients, and a device for realising said digital filter as a sum of outputs of Finite Impulse Response ("FIR") filter elements, wherein inputs of the FIR filter elements are dependent upon said partial filter input initial condition and said partial filter output initial condition, and said current block of filter input signal values.

24 Claims, 9 Drawing Sheets

U.S. PATENT DOCUMENTS

2004/0071207 A1* 4/2004 Skidmore et al. ........... 375/233

OTHER PUBLICATIONS

Digital Signal Processing, Alan V. Openheim/Ronald W. Schafer, *Prentice Hall Publishing*, pp. 133-134 (1975).

Digital Signal Processing, Alan V. Openheim/Ronald W. Schafer, *Prentice Hall Publishing*, pp. 133-134, 1975.

A Note on Digital Filter Synthesis, B. Gold, K.L. Jordan, *Proceedings of the IEEE*, Oct. 1968, pp. 1717-1718.

Read Signals Fast Fourier Transform: Storage Capacity and Step Number Reduction by Means of an Odd Discrete Fourier Transform, J.L. Vernet, *Proceedings of the IEEE*, Oct. 1971, pp. 1531-1532.

* cited by examiner

HIGH ORDER FILTERS WITH CONTROLLABLE DELAY AND PERFORMANCE

This application is a nationalization of and claims priority to PCT Application No. PCT/AU01/00514, filed on May 4, 2001, which published, in accordance with PCT Article 21(2), in the English language as publication No. WO 01/86808 on Nov. 15, 2001, which claims priority to Australian Provisional Application No. PQ7321, filed on May 5, 2000.

FIELD OF THE INVENTION

The present invention relates to the field of digital filters and, in particular, to a method and apparatus for efficient implementation of high order filters, with controllable processing delay and performance.

BACKGROUND OF THE INVENTION

Digital filters are, among other applications, used to model electronic environments. Typical applications of this type include audio filtering or modelling of acoustic system characteristics. The use of such filters allows incorporation of reverberation effects in audio signals, adaptive echo cancellation where echoes are undesirable, and production of audio signals having a "virtual reality" effect.

Other areas of application in addition to the audio field include seismic analysis and robotics.

A digital filter can be represented mathematically in terms of its impulse response. This response can form the basis for physical implementation which can fall into one of two distinct classes, namely Finite Impulse Response (FIR) filter implementations, and Infinite Impulse Response (HR) filter implementations. In general, as the complexity of the environment being modelled by the digital filter increases, the corresponding complexity of the filter structure must also increase, if it is to accurately, or at least realistically, model the environment. This correspondence between complexity of the modelled environment and the complexity of the filter structure applies to both FIR and IIR filter implementations. The complexity of the resulting filter is defined by the order of the filter structure.

Digital filters may, in principle, be implemented in the time domain, in which case a mathematical convolution process is used to relate the output of the filter to the input of the filter. Digital filters may, alternatively, be implemented in the transform domain, using, for example, Fast Fourier Transform AFT) techniques. In contrast to the time domain implementation where the convolution operation is required, in the transform domain a multiplication process relates the output signal of the filter to the input signal. This results in significant simplification and consequently, a reduction in the number of computations required when implementing a filter in the transform domain, as opposed to the time domain.

FFT filter implementation methods do, however, have a drawback in that they are block processes. Thus, where "N" is the order of the filter being considered, "N" samples of a digital signal must generally be stored before the first output of the filter can occur. This block processing therefore introduces delay (or latency) in the filter processing. In certain applications, latency causes unacceptable performance. For example, if audio and video signals are both being digitally processed in order to produce a multi-media presentation, differential delay between the audio and video signals of more than 10 milliseconds may cause lack of synchronisation to be perceived by a viewer.

Digital filters which are implemented using FIR techniques can, notwithstanding their fundamental block processing nature, be implemented in a manner in which latency may be reduced This requires that the impulse response of the filter which is being modelled be partitioned into a number of sections along a time axis, and that these sections each be processed by a suitable FFT structure. Further detail on this process may be found in U.S. Pat. No. 5,502,747 (McGrath). It is noted that McGrath is applicable to FIR filter implementations, however not to IIR filter implementations.

It is often the case that the impulse response which characterises the particular system being modelled has most of its energy, and consequently the important information, concentrated in the initial portion of the impulse response. Notwithstanding this distribution of energy and information, the system impulse response may often extend in time well beyond this initial portion FIR filter implementations are often approximated by implementing only the initial portion of the impulse response. This achieves an economic filter design, since the bulk of the information contained in the impulse response is included in the FIR model. The penalty however, is that the information in the "tail" of the impulse response is lost. Although this information may be of secondary importance, it may nonetheless be significant when considering the realism achieved by a filter which models an acoustic or other environment.

IIR filters are a generalisation of the FIR case and can, in some circumstances, have a simpler mathematical representation than FIR implementations, and thus can provide a filter implementation having a lower order for a given environment than an equivalent FIR filter.

It is considered desirable to provide a method for implementing digital filters with controllable processing delay and performance, applicable to both IIR and FIR filters.

SUMMARY OF THE INVENTION

According to a first aspect of the invention, there is provided a method of implementing a digital filter, said method comprising, for a current block of filter input signal values, the steps of:

first determining of a partial filter input initial condition, using a partitioned filter input signal, and partitioned filter input coefficients;

second determining of a partial filter output initial condition, using a partitioned filter output signal, and partitioned filter output coefficients; and realising said digital filter as a sum of outputs of FIR filter elements, wherein inputs of said FIR filter elements are dependent upon said partial filter input initial condition, said partial filter output initial condition, and said current block of filter input signal values.

According to another aspect of the invention, there is provided a digital filter comprising:

first means for determining of a partial filter input initial condition, using a partitioned filter input signal, and partitioned filter input coefficients;

second means for determining of a partial filter output initial condition, using a partitioned filter output signal, and partitioned filter output coefficients; and realising means for realising said digital filter as a sum of outputs of FIR filter elements, wherein inputs of said FIR filter elements are dependent upon said partial filter input initial condition, said partial filter output initial condition, and said current block of filter input signal values.

According to another aspect of the invention, there is provided a system using a digital filter wherein said digital filter comprises:

first means for determining of a partial filter input initial condition, using a partitioned filter input signal, and partitioned filter input coefficients;

second means for determining of a partial filter output initial condition, using a partitioned filter output signal, and partitioned filter output coefficients; and realising means for realising said digital filter as a sum of outputs of FIR filter elements, wherein inputs of said FIR filter elements are dependent upon said partial filter input initial condition, said partial filter output initial condition, and said current block of filter input signal values.

According to another aspect of the invention, there is provided a computer readable memory medium for storing a program for apparatus implementing a digital filter, said program comprising:

first code for determining of a partial filter input initial condition, using a partitioned filter input signal, and partitioned filter input coefficients;

second code for determining of a partial filter output initial condition, using a partitioned filter output signal, and partitioned filter output coefficients; and code for realising said digital filter as a sum of outputs of FIR filter elements, wherein inputs of said FIR filter elements are dependent upon said partial filter input initial condition, said partial filter output initial condition, and said current block of filter input signal values.

According to another aspect of the invention, there is provided a computer program for apparatus implementing a digital filter, said program comprising:

first code for determining of a partial filter input initial condition, using a partitioned filter input signal, and partitioned filter input coefficients;

second code for determining of a partial filter output initial condition, using a partitioned filter output signal, and partitioned filter output coefficients; and code for realising said digital filter as a sum of outputs of FIR filter elements, wherein inputs of said FIR filter elements are dependent upon said partial filter input initial condition, said partial filter output initial condition, and said current block of filter input signal values.

BRIEF DESCRIPTION OF THE DRAWINGS

A preferred embodiment of the invention will now be described, by way of example only, with reference to the accompanying drawings, in which.

DETAILED DESCRIPTION INCLUDING BEST MODE

Figure 1:
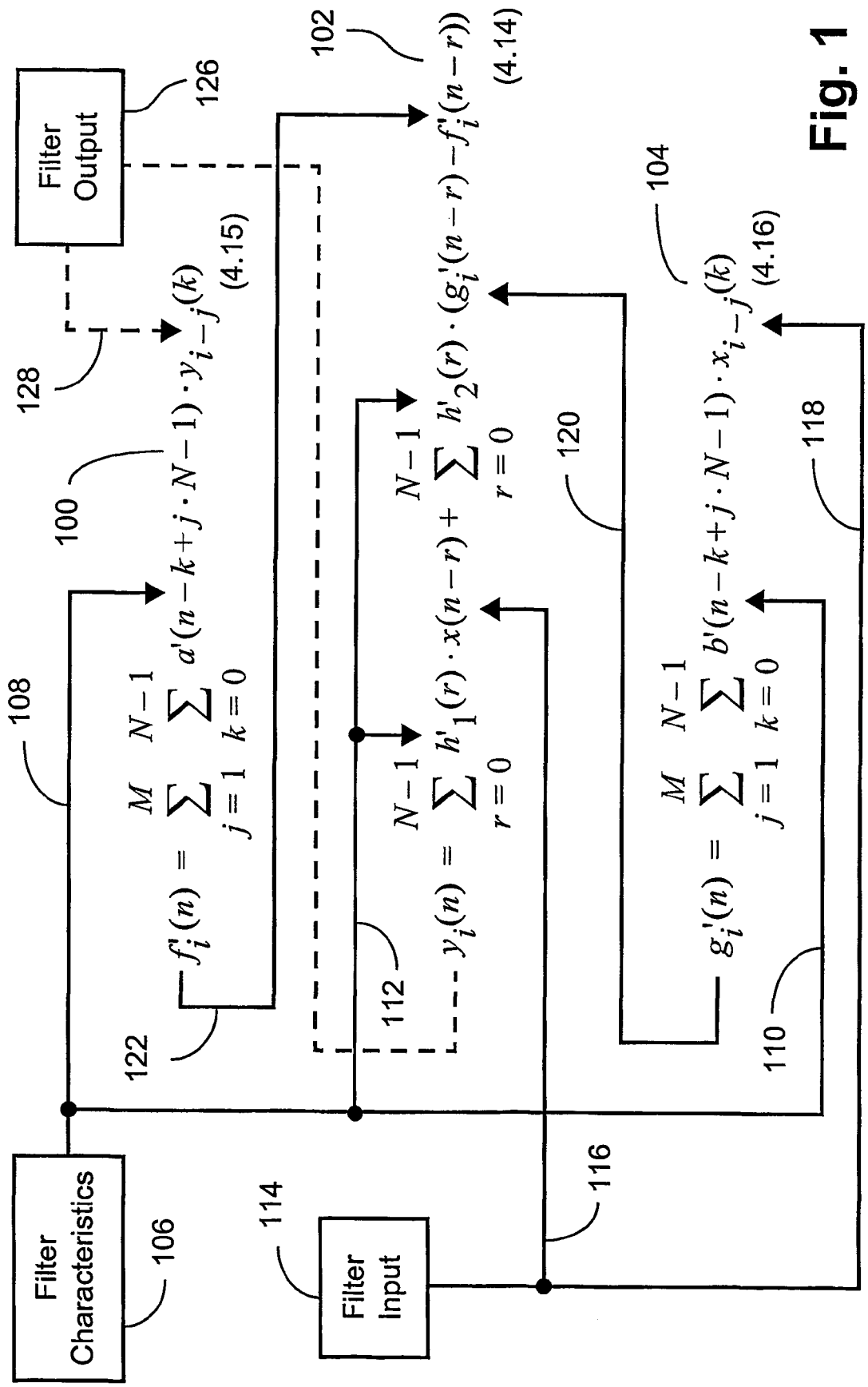
FIG. 1 depicts the relationship between key equations utilised in a first embodiment.

Where reference is made in any one or more of the accompanying drawings to steps and/or features, which have the same reference numerals, those steps and/or features have, for the purposes of this description, the same function(s) or operation(s), unless the contrary intention appears.

The general convolution Equation describing a digital filter with an input x(n) and an output y(n) is as follows:

$$\sum_{m=0}^{na} a(m) \cdot y(n-m) = \sum_{r=0}^{nb} b(r) \cdot x(n-r) \quad (1)$$

where:

y(n) is the output sequence x(n) is the input sequence a(n) is the output coefficient window b(n) is the input coefficient window na is the order of the output coefficient window nb is the order of the input coefficient window "m" and "r" are the indices of the summations The normalised time domain representation of the output of an IIR filter structure is derived from equation (1), and is provided by the following mathematical equation:

$$y(n) = \sum_{r=0}^{nb} b(r) \cdot x(n-r) - \sum_{m=1}^{na} a(m) \cdot y(n-m); \quad a(0) = 1 \quad (2)$$

where y(n) is the IIR filter output response. If a(m)=0 for all m>0, then this describes an FIR filter. A z-transform representation of y(n) is provided by the following mathematical equation:

$$Y(z) = \frac{X(z) \cdot B(z)}{A(z)}, \quad a(0) = 1. \quad (3)$$

where z is a complex variable; and

X(z) is the z transform of the input sequence x(n), B(z) is the z transform of the input coefficient window b(n), and A(z) is the z transform of the output coefficient window a(n).

IIR filters can be implemented using FFT techniques, by decomposing the IIR system into segments, and specifying the initial conditions for each segment. This is conveniently performed using z-transform techniques. Thus, Equation (3) can be represented as follows:

$$Y(z) = \frac{X(z) \cdot B(z)}{A(z)} + \frac{G(z) - F(z)}{A(z)} \quad (4)$$

where F(z) and G(z) are the z-transforms of the initial conditions f(n) and g(n).

The relationship between f(n) and its z transform F(z), and between g(n) and its z transform G(z), are given by the following two equations:

$$F(z) = \sum_{n=0}^{na-1} f(n) \cdot z^{-n} \quad (5)$$

$$G(z) = \sum_{n=0}^{nb-1} g(n) \cdot z^{-n} \quad (6)$$

The time domain representations for f(n) and g(n) are provided by the following equations:

$$f(n) = \sum_{r=0}^{na-n-1} a(n+r+1) \cdot y(-1-r), \quad 0 \le n \le na-1 \quad (7)$$

$$g(n) = \sum_{r=0}^{nb-n-1} b(n+r+1) \cdot x(-1-r), \quad 0 \le n \le nb-1 \quad (8)$$

Considering equation (4), if $h_1(n)$ is defined to be the inverse z-transform of B(z)/A(z), and $h_2(n)$ to be the inverse z-transform of 1/A(z), then the solution in the time domain to Equation (4) can be written as follows:

$$y(n) = \sum_{r=0}^{\infty} h_1(r) \cdot x(n-r) - \sum_{r=0}^{\infty} h_2(r) \cdot f(n-r) + \sum_{r=0}^{\infty} h_2(r) \cdot g(n-r); \quad 0 \le n \quad (9)$$

Equation (9) which is couched in the time domain, shows how the output y(n) of the IIR filter can be written as the sum of three convolutions. It is noted that the impulse responses $h_1(n)$ and $h_2(n)$ have infinite summation limits, and hence are not amenable to direct implementation. However, since only N output samples are of interest, Equation (9) can be re-written in terms of N output samples only, as follows:

$$y(n) = \sum_{r=0}^{N-1} h_1(r) \cdot x(n-r) - \sum_{r=0}^{na-1} h_2(r) \cdot f(n-r) + \sum_{r=0}^{nb-1} h_2(r) \cdot g(n-r) \quad (10)$$

where 0<=n<N

Equation (10) shows that the next N output samples of y(n) can be written as the sum of three finite convolutions for any section of length N, provided that the initial conditions which pertain to that section are known.

Calculation of the initial conditions (i.e. equations (7) and (8)) requires that the previous "nb" input samples, and the previous "na" output samples be available (where "na" and "nb" are the upper limits of the summations of the convolutions for $h_2$ in Equation (10)).

The following substitution of variables is performed in regard to Equations (7) and (8):

$$k = n+r+1$$

Equations (7) and (8) then have the following resultant form:

$$f(n) = \sum_{k=n+1}^{na} a(k) \cdot y(n-k), \quad 0 \le n \le na-1 \quad (11)$$

$$g(n) = \sum_{k=n+1}^{nb} b(k) \cdot x(n-k), \quad 0 \le n \le nb-1 \quad (12)$$

The convolutions in Equations (10)-(12) are finite, and thus lend themselves to physical implementation, for example using FFT techniques. The length of the required FFT structure is given by the following:

$$N_{FFT} \ge (\text{Maximum value of } na \text{ or } nb) + N \quad (13)$$

Equation (10) enables the output y(n) of the filter to be calculated at a future time "n" by calculating three convolutions. Thus, Equation (10) enables the filter output to be calculated at any future time n, where n lies between 0 and N−1. Considering the time domain representation of the output signal being calculated, this means that the signal y(n) extends from time 0 onwards towards infinity, calculated in blocks of N samples.

For a filter of order N, the latency is proportional to N. Equation (12) shows that the FFT implementation length $N_{FFT}$ must be greater than the larger of the order of a(n) and b(n) (i.e., "na" and "nb" respectively, as seen from Equation (1).

The latency of the present filter structure being considered is N, and since the FFT implementation length $N_{FFT}$ must be greater than the order of both a(n) and, b(n), the generally used "overlap and save" FFT algorithm is most efficiently implemented when the delay (in samples), i.e. the order of the filter, is defined by the following equation:

$$N = N_{FFT}/2$$

This condition limits the order of the IIR filter to N (i.e. length is N+1).

An FFT filter structure of length N can be "executed" as often as desired in order to obtain the filter output values. Thus, for example, an FFT structure of order 4096 can, if desired, be executed every 512 samples (i.e. $N_{FFT}$ is equal to 8N). Under these conditions however, the FFT algorithm becomes very inefficient, where efficiency is defined as the number of multiply-and-accumulate operations required per sample of output signal.

The problem of efficiency vs delay exists when N<na or N<nb, and can be solved by the method described herein. Since only N output samples of Equation (10) are of interest, it follows that only N samples of f(n), g(n), $h_1(n)$, $h_2(n)$ are required. The sample values for $h_1(n)$ and $h_2(n)$ are known, and thus solution of Equation (10) is reduced to the problem of finding an efficient method of calculating the first N samples for both f(n) and g(n). To simplify computation, the new variable M is introduced, where:

$$M.N = na = nb \quad (14)$$

This simplification is not necessary in general. There can be an M value for b(n) (ie. $M_b$), and an M value for a(n) (ie. $M_a$). The corresponding general conditions are then given by $$M_a.N \ge na+1$$

$$M_b.N \ge nb+1 \quad (14a)$$

In order to ensure that Equation (14) is true in general, the sequences a(n) and b(n) in Equations (11) and (12) are zero padded. This is explained in more detail with reference to FIGS. 3 and 4. A change in notation is also introduced to Equation (10), namely a subscript "i" is added to y(n), in order to indicate that the ith block of N samples of y(n) is being considered, beginning at i=0. With the above mentioned changes of variables and notation introduced, Equation (10) can be written as follows:

$$y_i(n) = \sum_{r=0}^{N-1} h'_1(r) \cdot x_i(n-r) + \sum_{r=0}^{N-1} h'_2(r) \cdot (g'_i(n-r) - f'_i(n-r)); \quad (15)$$

$$0 \leq n < N$$

where:

$y_i(n) = y(n+i.N)$; where $0 \leq n < N$ and $0 \leq i < \infty$ $x_i(n) = x(n+i.N)$; where $0 \leq n$ and $0 \leq i < \infty = y_i(n) = 0$; $N \leq n$ or $n<0$ $h'_1(n)$=first N samples of $h_1(n)$ $h'_2(n)$=first N samples of $h_2(n)$ $f'(n)$=first N samples of f(n) i.e., partial initial conditions of output at time i.N $g'(n)$=first N samples of g(n) i.e., partial initial conditions of input at time i.N Equation (11) can be rewritten using the new variable M, and by partitioning y(n) into blocks of N samples, the equation can be expressed as follows:

$$f'_i(n) = \sum_{k=n+1}^{MN-1} a(k) \cdot y(i \cdot N + n - k), \; 0 \leq n < N \quad (16)$$

Let $a'(n) = a(n)$, $1 \leq n < M \cdot N$ $a'(n)=0$, elsewhere

A similar equation can be written for $g_i'(n)$. Equations (11) and (12) can accordingly be rewritten as follows:

$$f'_i(n) = \sum_{j=1}^{M} \sum_{k=0}^{N-1} a'(n-k+j \cdot N - 1) \cdot y_{i-j}(k) \quad (17)$$

$$g'_i(n) = \sum_{j=1}^{M} \sum_{k=0}^{N-1} b'(n-k+j \cdot N - 1) \cdot x_{i-j}(k) \quad (18)$$

Thus, using Equation (17), the first N samples of f(n) can be calculated by performing an N point convolution M times. Equation (18) similarly shows that the first N samples of g(n) can be calculated by performing an N point convolution M times. Equations (15), (17) and (18) provide the conceptual basis for implementing preferred arrangements of the invention.

Another arrangement is possible by partitioning a'(n) and b'(n) differently. In this method we break a'(n) into sections of length N as follows.

Let $a_m'(k) = a'(k+m.N)$, $0 \leq k < N$, $0 \leq m < M = 0$ elsewhere $$f'_i(n) = \sum_{j=1}^{M} \sum_{k=0}^{N-1} (a'_{j-1}(n+N-k-1) + a'_j(n-k-1)) \cdot y_{i-j}(k) \quad (19)$$

$$g'_i(n) = \sum_{j=1}^{M} \sum_{k=0}^{N-1} (b'_{j-1}(n+N-k-1) + b'_j(n-k-1)) \cdot x_{i-j}(k) \quad (20)$$

We note from equation (19) that $a_{j-1}'(n+N-k-1)$ is a time shifted version of $a_{j-1}'(n+k-1)$, where the shift is by N samples. If we only store coefficients $a_m(k)$ and $b_m(k)$ then the convolution equations (19) and (20) can be computed by shifting before multiplication. In the frequency domain is this equivalent to multiplying by a complex exponential. If a Modified Discrete Fourier Transform (MDFT) form of the DFT is used this is equivalent to multiplication by the complex operator $-j(\sqrt{-1})$. Further details on the MDFT can be found in J. L. Vernet—"Real Signals Fast Fourier Transform: Storage Capacity and Step Number Reduction by Means of an Odd Discrete Fourier Transform", IEEE Proc., October 1971 pp 1531-1532.

A special class of IIR filters exist in which b(n) is an impulse, these filters being known as 'All pole IIR filters'. The all pole requirement is expressed mathematically as follows:

$b(n)=b_0$, n=0

$b(n)=0$, elsewhere

This class of filter has many applications in signal processing including speech synthesis and speech recognition. Further optimisations of arrangements for such filters can be performed, since there is no need to calculate g(n), and $h_1(n)$ and $h_2(n)$ are the same.

A similar case can be applied to represent FIR filters if the following conditions are applied.

$a(n)=0$, n>0

Equation (15) can be rewritten to take advantage of further optimisations in this case, since $h'_2(n)=1$ and $f_i(n)=0$ for all i. Equation (15) can thus be rewritten for the FIR case, and simplified as follows:

$$y_i(n) = \sum_{r=0}^{N-1} h'_1(r) \cdot x_i(n-r) + \sum_{r=0}^{N-1} g'_i(n-r) \quad (21)$$

Turning to FIG. 1, a block diagram representation depicting the relationship between the equations (15), (17) and (18) is shown. The key equations are depicted as 102 (see equation (15)), 100 (see equation (17)), and 104 (see equation (18)). Filter characteristics 106 are provided as inputs to the process, providing the basis for ascertaining the a'(n) coefficients (see arrow segment 108) and the b'(n) coefficients (see arrow segment 110). These characteristics 106 also provide the basis for ascertaining the $h'_1(r)$ coefficients and $h'_2(r)$ coefficients (see arrow segment 112). Filter "previous" input values 114 are also provided to the process, and are utilised in the equation 102 (see arrow segment 116) and in the equation 104 (see arrow segment 118). The "previous" filter output values are also provided to the process, and are utilised in the equation 100 (see dashed arrow segment 128). The equation 104 outputs the $g'_i(n)$ coefficients, and these are provided to the equation 102 as depicted by an arrow segment 120. The equation 100 outputs the $f'_i(n)$ coefficients, and these are provided to the equation 102 as depicted by an arrow segment 122. The equation 102, having been provided with inputs as described above, outputs a filter output $y_i(n)$ (depicted as 126) for the ith block of N data samples. This is required not only as the actual output 126 of the filter, but also as an input to the equation 100 in the next iteration of the process, as depicted by the dashed arrow segment 128.

Figure 2:
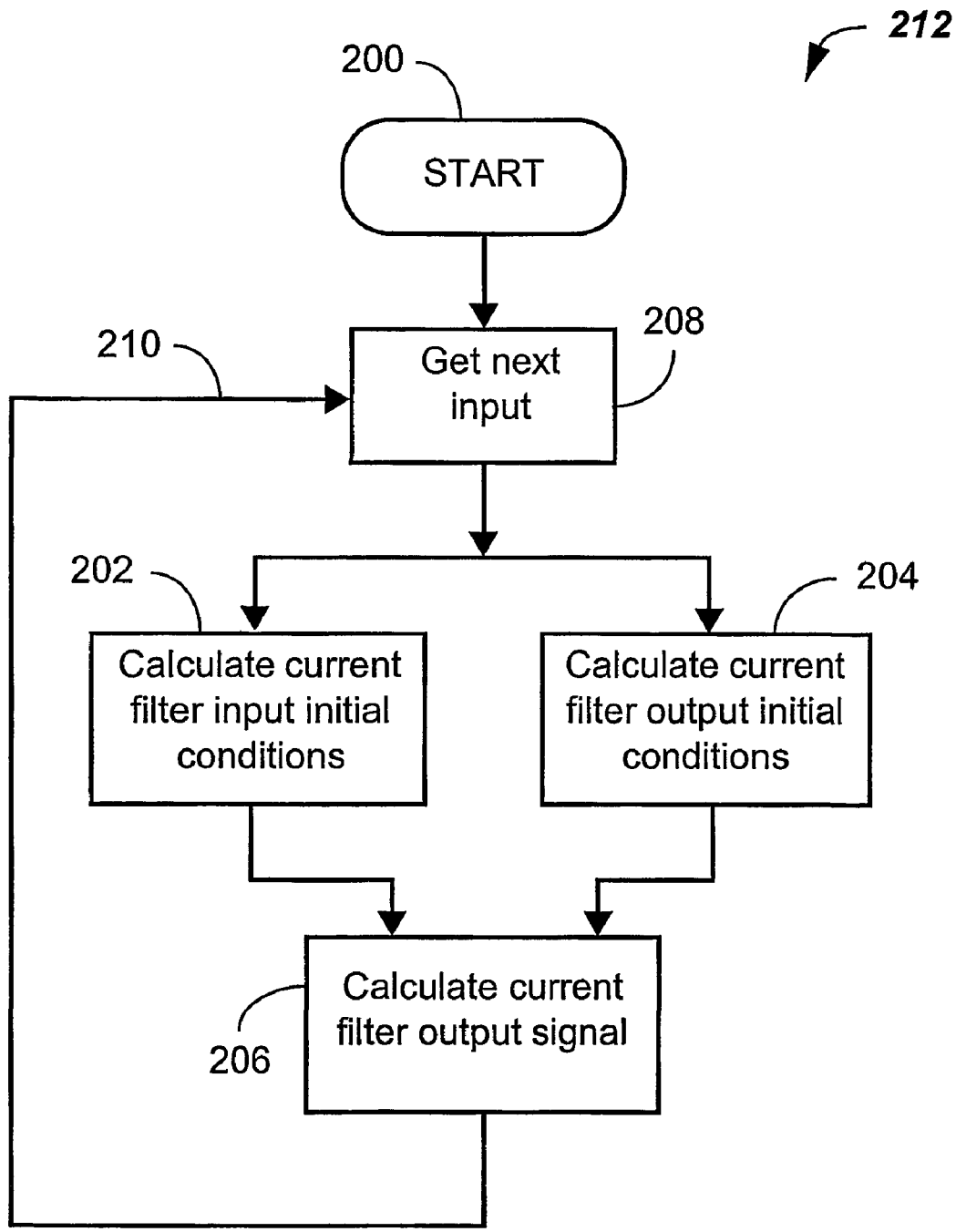
FIG. 2 illustrates a flow diagram for determining a filter output signal.

Turning to FIG. 2, a process 212 for the determination of a filter output in accordance with equations (15), (17) and (18) is shown. The process 212 commences with start step 200, after which it proceeds to a step 208 where a new input block is obtained. The process 212 proceeds to steps 202 and 204, where current input and output filter initial conditions respectively are calculated. Thereafter, in a step 206, a current filter output signal is calculated. The process 212 then returns, as depicted by an arrow 210, to the step 208 and repeats as previously described.

Figure 3:
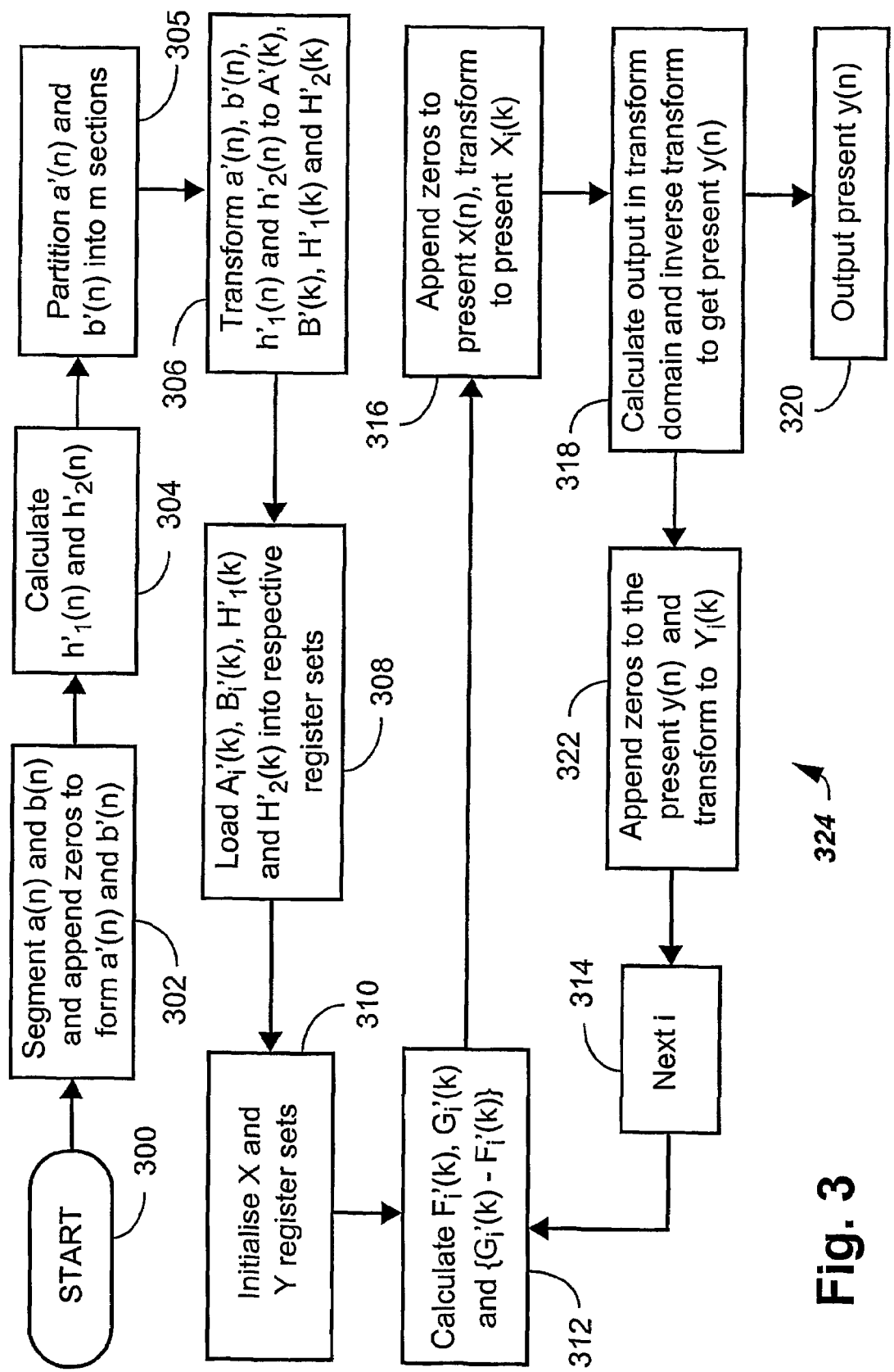
FIG. 3 presents a more detailed view of the process flow diagram of FIG. 2.

Turning to FIG. 3, a more detailed flow diagram for the aforementioned process, now designated by the reference numeral 324, is shown. The process 324 commences with a start step 300, and progresses to a step 302 where a(n) and b(n) coefficients are segmented in time, and padded with zeros to form segmented coefficient sets a'(n) and b'(n). Proceeding to a step 304, $h'_1(n)$ and $h'_2(n)$ are calculated in accordance with Equation (24). In a following step 305, a'(n) and b'(n) are partitioned into m sections, as described in more detail in regard to FIG. 4. Thereafter in a step 306, a'(n), b'(n), $h'_1(n)$ and $h'_2(n)$ are transformed from the sampled time domain into a sampled frequency domain, preferably using a modified Discrete Fourier Transform (MDFT). In a next step 308, transformed values A'(k) are loaded into an "AK" register set, B'(k) values are loaded into a "BK" register set, and $H'_1(k)$ and $H'_2(k)$ are loaded into "H1K" and "H2K" registers respectively. Proceeding to a step 310, register sets X and Y which store previous $X_{i-m}(k)$ and previous $Y_{i-m}(k)$ values respectively, are initialised, typically with zeros and where 'm' varies from 1 to M. In a following step 312, initial conditions $F_i'(k)$, $G_i'(k)$ and $\{G_i'(k)-F_i'(k)\}$ are determined. Moving to a step 316, the "present" $X_i(k)$ is calculated by appending zeros to the "present" x(n) values, and the resultant sequence is transformed to become the "present" $X_i(k)$. Moving to a step 318, the "present" $Y_i(k)$ value is calculated, and inverse transformed into "present" y(n) values which represent the desired filter output. These values are output in a step 320. The "present" y(n) value is also zero padded and transformed to $Y_i(k)$ in a step 322. Moving to a step 314, the next 'i' is calculated, which can be performed by (i) modifying the register sets X and Y such that $X_{i-M}(k)$ and $Y_{i-M}(k)$ are discarded, and (ii) shifting contents of the registers down such that $X_{i-M}(k)=X_{i-m+1}(k)$ and $Y_{i-M}(k)=Y_{i-m+1}(k)$ for m=M, m=M-1, . . . , m=2, such that the Y(k) calculated at step 322 becomes $Y_{i-1}(k)$ for the next cycle of the method, and the X(k) calculated at step 316 becomes $X_{i-1}(k)$ for the next cycle of the process 324. The process 324 then proceeds again to the step 312 and so on.

Figure 4:
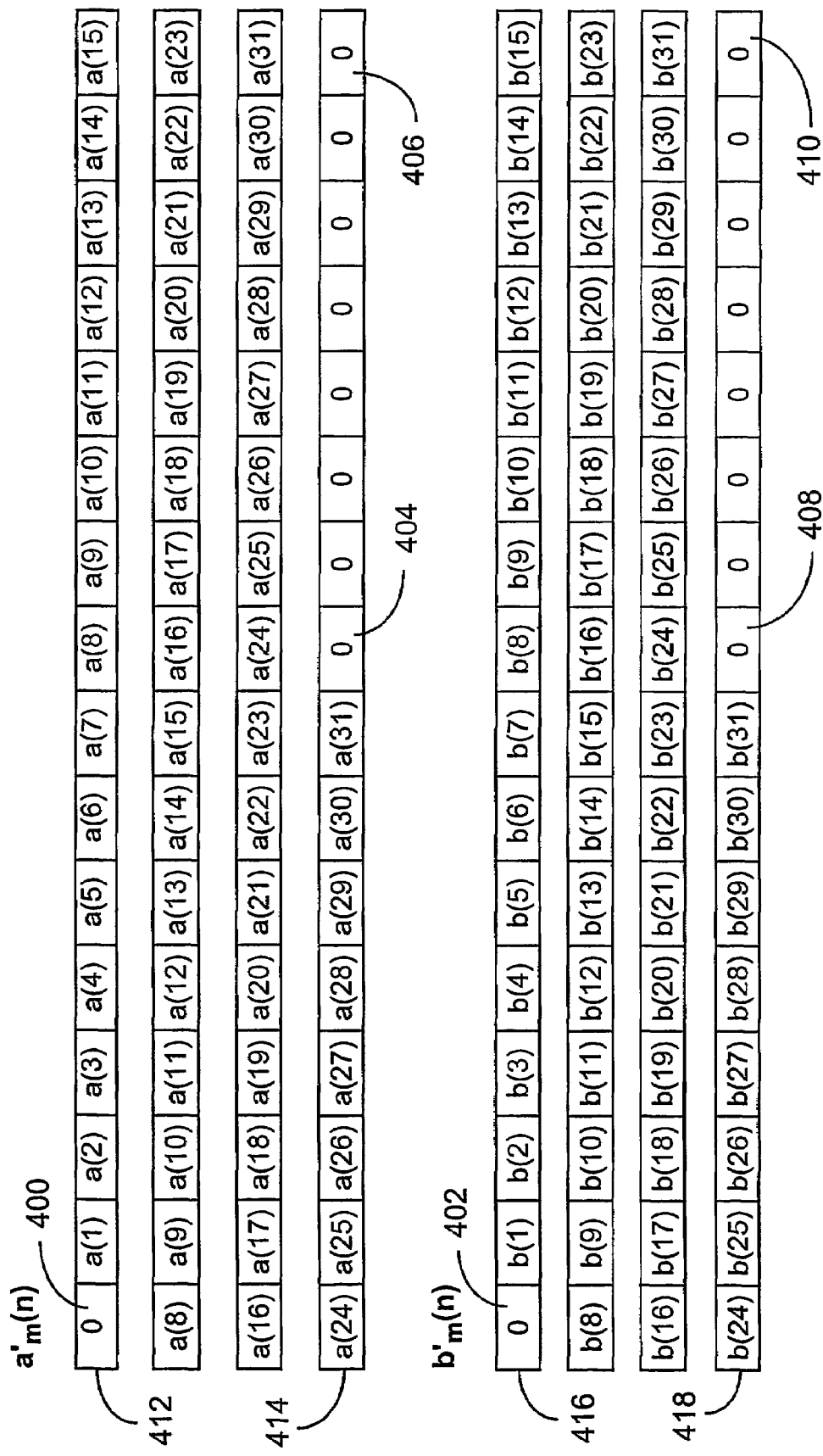
FIG. 4 depicts filter coefficients for a first arrangement, after segmentation and zero-padding.

A first exemplary arrangement is now described, firstly in relation to FIG. 4. Having reference to Equation (2) which shows a general form of an IIR filter having coefficients a(n) and b(n), for the purposes of the example, the following is defined:

$$na+1=nb+1=M.N \quad (22)$$

where na=nb=31, N=8, hence M=4

$$\sum_{k=0}^{31} a(k) \cdot y(n-k) = \sum_{r=0}^{31} b(r) \cdot x(n-r) \quad (23)$$

a(0)=1, ie. normalised coefficients

Turning to FIG. 4, the segmentation (see the step 302 in FIG. 3) of the coefficients a(n) and b(n) proceeds by setting the first sample a(0) (depicted as 400 in FIG. 4) and b(0) (depicted as 402 in FIG. 4) equal to zero and appending N zeros (depicted as 404-406 in FIG. 4) to a(n) and N zeros (depicted as 408-410 in FIG. 4) to b(n) to create the coefficients a'(n) and b'(n). The coefficients a'(n) and b'(n) are then broken into M sections of 2.N samples where each section overlaps the previous section by N samples. The segmented coefficients $a'_m(n)$ and $b'_m(n)$ are depicted as 412-414 and 416-418 respectively in FIG. 4.

The coefficients $h_1(n)$ and $h_2(n)$ are calculated (see the step 304 in FIG. 3) from the convolution of Equation (2) where the input is a unit impulse as shown in the following Equations.

$$h'_1(n) = b(n) + \sum_{r=1}^{N} a(r) \cdot h'_1(n-r) \quad (24)$$

$$h'_2(n) = \sum_{r=1}^{N} a(r) \cdot h'_2(n-r) \quad 0 \leq n < N$$

The coefficients $a'_m(n)$, $b'_m(n)$, $h'_1(n)$, and $h'_2(n)$ are then transformed (see the step 306 in FIG. 3) from the sampled time domain into a sampled frequency domain with a Fast Fourier Transform (FFT), a Modified Discrete Fourier Transform (MDFT), or any other variant of the Discrete Fourier Transform (DFT) such that the operation of convolution in the time domain is equivalent to multiplication in the transformed domain. In fact, any other transform can be used in which convolution in the time domain is equivalent to a less computationally intensive operation in the transform domain. The transformed coefficients are $A'_m(k)$, $B'_m(k)$, $H'_1(k)$, and $H'_2(k)$ respectively. The preferred arrangement uses a MDFT since this form of the DFT is optimised for real coefficients and transforms 2.N real time samples into N complex frequency samples. The transformed coefficients using the MDFT are shown mathematically in equations (25)-(28).

$$A'_m(k) = \sum_{n=1}^{N} (a'_m(n) - j * a'_m(n+N)) \cdot W_N^{nk} \cdot W_{2 \cdot N}^{n/2}, 0 \leq k < N. \quad (25)$$

$$B'_m(k) = \sum_{n=1}^{N} (b'_m(n) - j * b'_m(n+N)) \cdot W_N^{nk} \cdot W_{2 \cdot N}^{n/2}, 0 \leq k < N. \quad (26)$$

$$H'_1(k) = \sum_{n=1}^{N} (h'_1(n) - j * h'_1(n+N)) \cdot W_N^{nk} \cdot W_{2 \cdot N}^{n/2}, 0 \leq k < N. \quad (27)$$

$$H'_2(k) = \sum_{n=1}^{N} (h'_2(n) - j * h'_2(n+N)) \cdot W_N^{nk} \cdot W_{2 \cdot N}^{n/2}, 0 \leq k < N. \quad (28)$$

where $0 \leq m < M$

Figure 5:
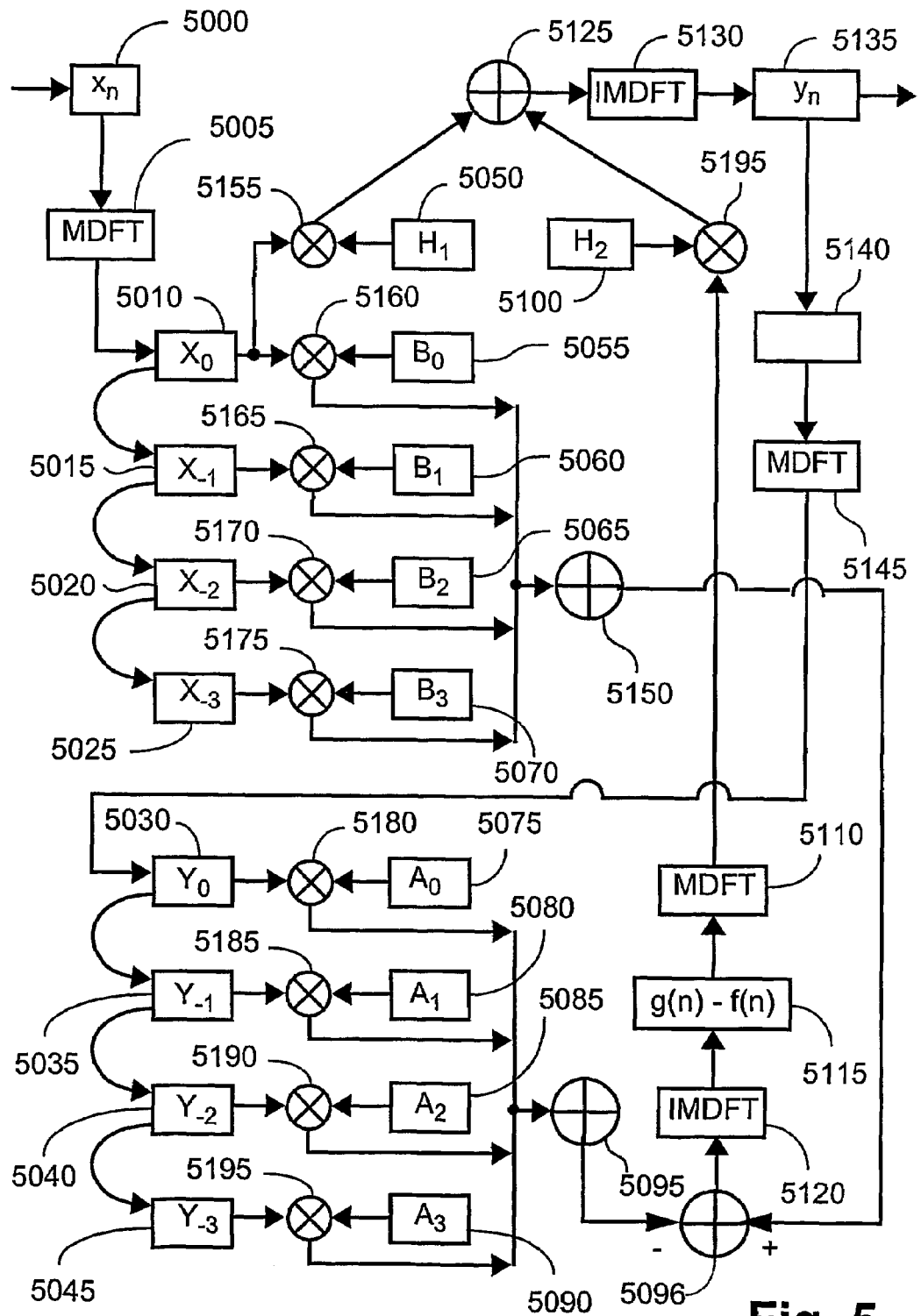
FIG. 5 illustrates an apparatus for implementing the first arrangement.

Turning to FIG. 5, still having regard to the first arrangement, the transformed coefficients $H'_1(k)$ and $H'_2(k)$ are placed into storage registers 5050 and 5100. A number of storage buffers 5010-5045 for the transformed input signal $X_m(k)$ and transformed output signal $Y_m(k)$ are initialised with zeros. The input signal x(n), which is stored in a register 5000 is sampled and is processed in blocks of N samples. Previously transformed inputs $X_m(k)$ are stored in the storage buffers 5010-5025 and previously transformed outputs $Y_m(k)$ are stored in the storage buffers 5030-5045. The transformed contents of the input storage buffers 5010-5025 are multiplied, using respective multipliers 5160-5175 by respective coefficients $B'_m(k)$, which are stored in a corresponding number of registers 5055-5070. The multiplication results are summed in a summer 5150. The transformed contents of the output storage buffers 5030-5045 are similarly multiplied, using respective multipliers 5180-5195, by coefficients $A'_m(k)$ which are stored in respective registers 5075-5090. The multiplication result is summed in a summer 5095.

In an alternative arrangement, the two distinct summation points shown in FIG. 5 (ie. 5095 and 5150), can be implemented by a single summation unit. The need for separate summation units becomes evident if $M_a$ does not equal $M_b$ as shown in equations (14a). In the illustrated arrangement in FIG. 5, $M_a$ equals $M_b$ which equals M which equals 4.

The result from the summer 5150 is directed to a positive polarity input of a summer 5096. The result from the summer 5095 is directed to a negative polarity input of the summer 5096. The summer 5096, by virtue of the aforementioned polarities, subtracts the result from the summer 5150 from the result from the summer 5095. The result of the aforementioned subtraction is directed to the Inverse MDFT operation 5120. In an alternative arrangement, the subtraction can be converted to a summation by negating (ie reversing the polarity) of the coefficients $A'_m(k)$ which are stored in registers 5075-5090. The second half of the data (ie. samples from N to 2.N−1) from the Inverse MDFT process 5120 are the coefficients f'(n) and g'(n) as stated in equations (17)-(18). The first half (ie. samples from 0 to N−1) is the error resulting from circular convolution. The first half of the data is discarded to create N coefficients "g'(n)-f'(n)" which are stored in register 5115. The N coefficients "g'(n)-f'(n)" in register 5115 are appended with N zeros to create a sequence of length 2.N and then transformed via MDFT operation 5110 into N complex frequency samples. At this point the $X_m(k)$ input storage buffers 5010-5025 and the $Y_m(k)$ output storage buffers 5030-5045 are shifted one place down. The input shifting operation is as follows:

$X_{-3}(k)$ in register 5025 is discarded $X_{-2}(k)$ in storage buffer 5020 is placed in $X_{-3}(k)$ storage buffer 5025

$X_{-1}(k)$ in storage buffer 5015 is placed into $X_{-2}(k)$ storage buffer 5020

$X_0$ in storage buffer 5010 is placed in $X_{-1}(k)$ storage buffer 5015.

The output shifting operation is as follows:

$Y_{-3}(k)$ in register 5045 is discarded $Y_{-2}(k)$ in storage buffer 5040 is placed in $Y_{-3}(k)$ storage buffer 5045

$Y_{-1}(k)$ in storage buffer 5035 is placed into $Y_{-2}(k)$ storage buffer 5040

$Y_{-0}(k)$ in storage buffer 5030 is placed in $Y_{-1}(k)$ storage buffer 5035.

The shifting operation need not be a copying of data and in the preferred embodiment of the invention the position of the first storage buffer in relation to the rest is modified to avoid any copying of data. The N input samples x(n) in register 5000 are appended with N zeros and transformed via an MDFT operation 5005 to create N complex frequency samples which are then placed in $X_0(k)$ storage register 5010. The N new complex frequency input samples $X_0(k)$ in the register 5010 are multiplied via multiplier 5155 with coefficients $H'_1(k)$ in the register 5050. The previous calculation "G(k)-F(k)" which is stored in a register 5110, is multiplied via a multiplier 5195, with coefficients $H'_2(k)$ which are stored in the register 5100. The output from the multipliers 5155 and 5195 are summed in a summer 5125, the output of which is then transformed via an Inverse MDFT operation 5130. The first N samples of the resultant are kept and placed in a y(n) output storage buffer 5135. The N samples of y(n) are then appended with N zeros and stored in a register 5140. The appended N samples are then transformed via a MDFT operation 5145, and the result is placed in a $Y_0(k)$ storage buffer 5030. The procedure then continues for each block of N inputs of x(n) stored in register 5000 creating N outputs of y(n) 5135. An exemplary code fragment relating to FIG. 5 using the Matlab™ Simulation Package, Release 11, v5.1, is contained in the Appendix.

The special case of an all pole filter is similar to above, however the storing of previous inputs $X_{-1}(k)$, $X_{-2}(k)$, and $X_{-3}(k)$ in registers 5015-5025 is not necessary since the values of $B'_m(k)$ are all zero. Also in the all pole case $H1(k)$ and $H2(k)$ are the same so the multiplications at 5155 and 5195 and summation at 5125 can be optimised to a single multiplication and addition.

Figure 6:
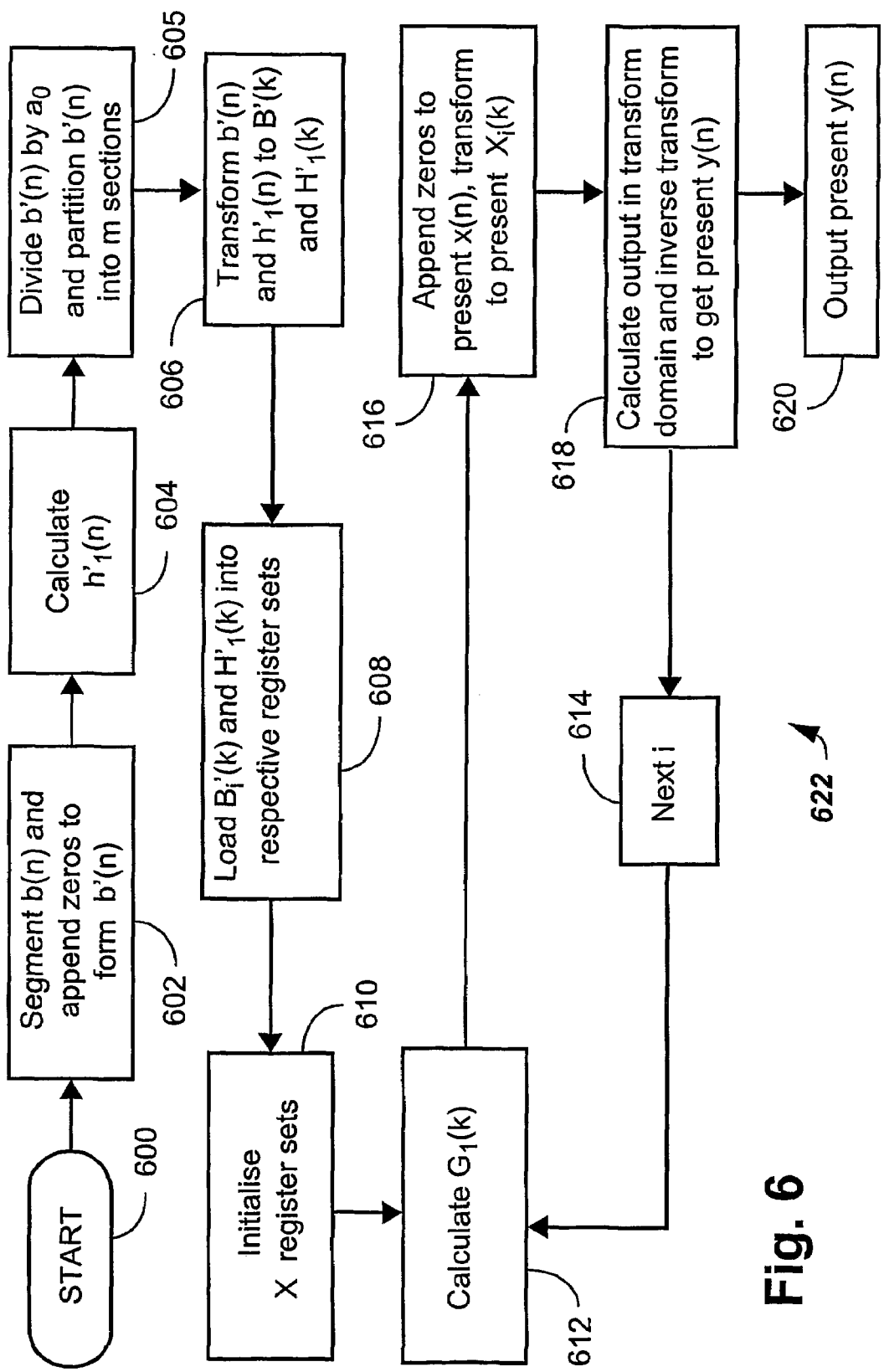
FIG. 6 depicts a flow diagram for a second arrangement.

Turning to FIG. 6, a process flow diagram for another arrangement, being an "FIR filter" according to equation (21), is shown. The process 622 commences with a start step 600, and progresses to a step 602 where b(n) coefficients are segmented in time, and padded with zeros to form a segmented coefficient set b'(n). Proceeding to a step 604, $h'_1(n)$ is calculated. In a step 605, b'(n) is partitioned into m sections. Thereafter in a step 606, b'(n), and $h'_1(n)$ are transformed from the sampled time domain into a sampled frequency domain, preferably using a modified Discrete Fourier Transform (MDFT). In a next step 608, the transformed values $B'_m(k)$ are loaded into an "BK" register set, and the values $H'_1(n)$ are loaded into "H1K" registers respectively. Proceeding to a step 610, the register set X for holding $X_{i-m}(k)$ values is initialised, typically with zeros, and where m varies from 1 to M. In a following step 612, the initial conditions $G'_i(k)$ are calculated. Moving to a step 616, the "present" $X_i(k)$ is calculated by appending zeros to the "present" x(n) values, and the resultant sequence is transformed to become the "present" $X_i(k)$. Moving to a step 618, the "present" Y(k) value is calculated, and inverse transformed into "present" y(n) which is the desired filter output, these being output in a step 620. Moving to a step 614 the next 'i' is calculated, which can be considered to be the action of modifying register set X such that $X_{i-M}(k)$ is discarded, and the register values are shifted down such that $X_{i-m}(k)=X_{i-m+1}(k)$ for m=M, m=M−1, . . . , m=2, such that X(k) value calculated at the step 616 becomes the $X_{i\_1}(k)$ value for the next cycle. The method 622 then proceeds to the step 612 and so on.

Figure 7:
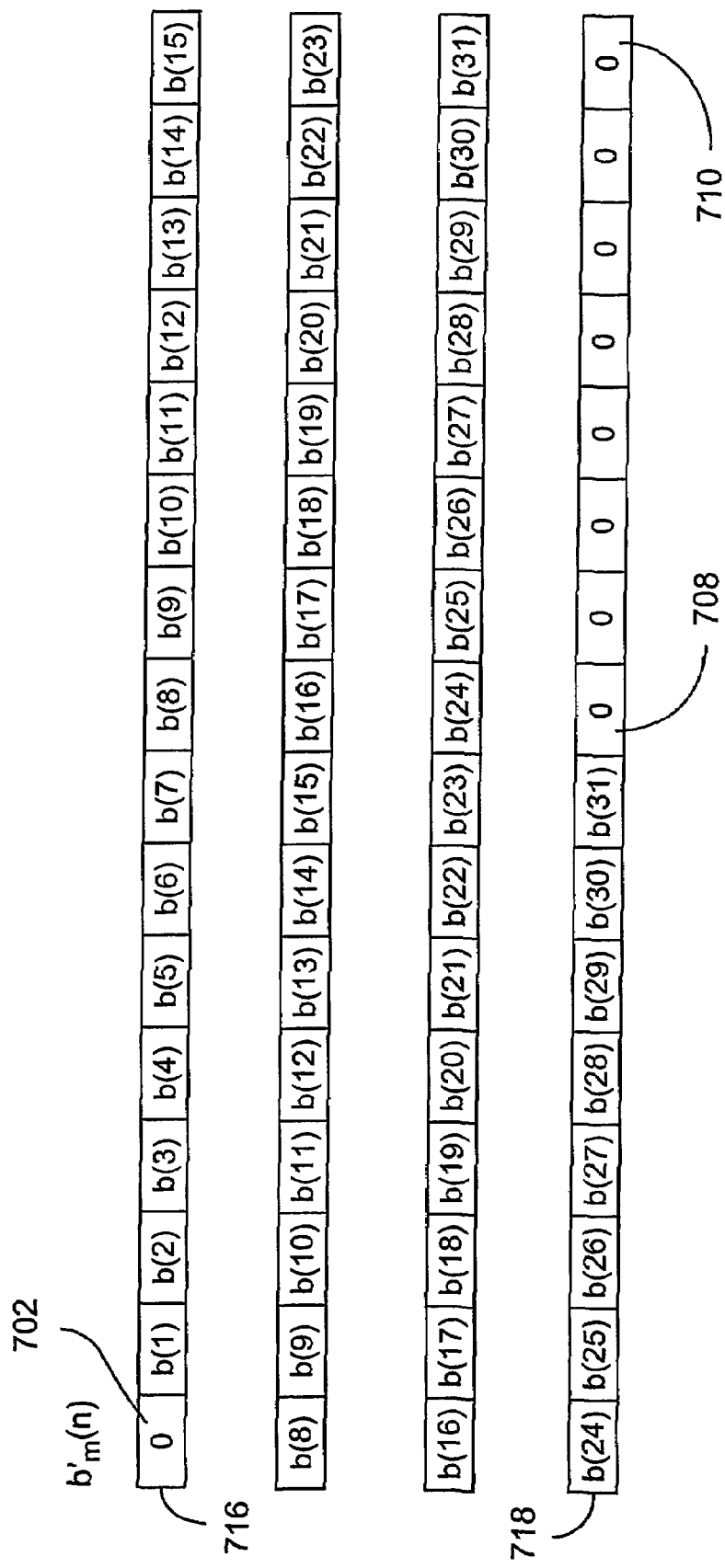
FIG. 7 illustrates coefficients for the second arrangement after segmentation and zero padding.

Turning to FIG. 7, exemplary data for the second arrangement is shown. Having reference to Equation (21) which relates to an FIR filter having coefficients b(n), equations (22) and (23) are restated here for the FIR case, the restated equations being designated as Equations (29) and (30).

$$nb+1=M.N \qquad (29)$$

and nb=31, N=8, hence M=4

$$y(n) = \sum_{r=0}^{31} b(r) \cdot x(n-r) \qquad (30)$$

The segmentation of the coefficients b(n) proceeds by setting the first sample b(0) (depicted as 702 in FIG. 7) equal to zero and appending N zeros (depicted as 708-710 in FIG. 7) to b(n) to create the coefficients b'(n). The coefficients b'(n) are then broken into M sections of 2.N samples each, where each section overlaps the previous section by N samples. The segmented coefficients b'$_m$(n) are shown as 716-718 in FIG. 7.

The coefficients h'$_1$(n) are the first N (where N=8) samples of b(n) and h$_2$(n) is equal to "1", this being expressed mathematically as follows:

$$h'_1(n) = b(n) \; n = 0 \ldots 7 \qquad (31)$$

The coefficients b'$_m$(n), and h'$_1$(n) are then transformed from the sampled time domain into a sampled frequency domain with a Fast Fourier Transform (FFT), a Modified Discrete Fourier Transform (MDFT), or any other variant of the Discrete Fourier Transform (DFT) such that the operation of convolution in the time domain is equivalent to multiplication in the transformed domain. The transformed coefficients are B'$_m$(k), and H'$_1$(k) respectively. An MDFT is again preferably used since this form of the DFT is optimised for real coefficients and transforms 2.N real time samples into N complex frequency samples. The transformed coefficients using the MDFT, shown mathematically in equations (25)-(28), are restated here for convenience as follows:

$$B'_m(k) = \sum_{n=1}^{N} (b'_m(n) - j*b'_m(n+N)) \cdot W_N^{nk} \cdot W_{2N}^{n/2}, \; 0 \le k < N. \qquad (32)$$

$$H'_1(k) = \sum_{n=1}^{N} (h'_1(n) - j*h'_1(n+N)) \cdot W_N^{nk} \cdot W_{2N}^{n/2}, \; 0 \le k < N. \qquad (33)$$

where $0 \le m < M$

Figure 8:
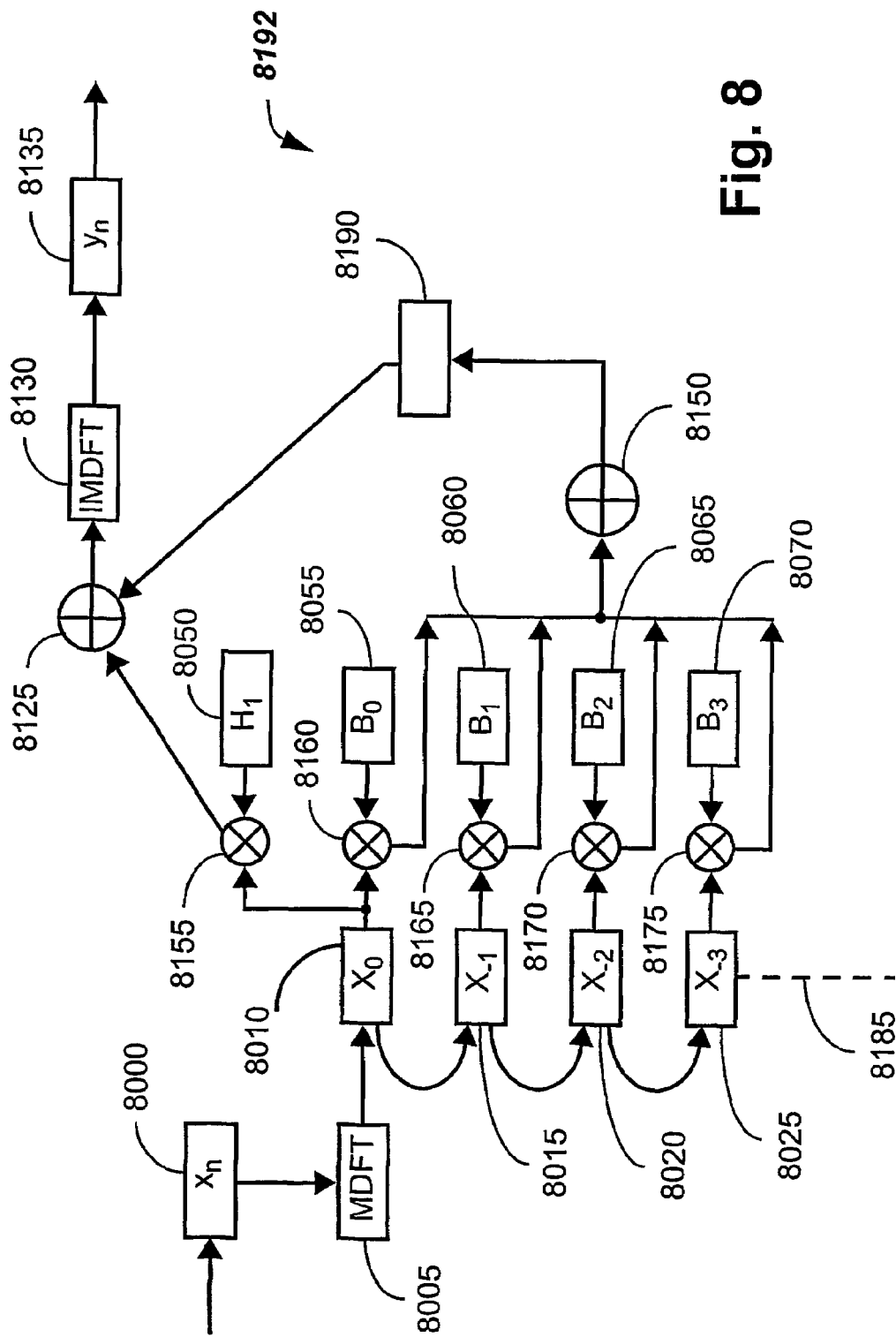
FIG. 8 depicts an apparatus for implementing the second arrangement.

Turning to FIG. 8, an apparatus 8192 for implementing the aforementioned second arrangement is shown. The transformed coefficients H'$_1$(k) relating to the second arrangement are placed into a storage register 8050. Storage buffers 8010-8025 for the transformed input signal X$_m$(k) are initialised with zeros. The input signal x(n), which is stored in a register 8000, is sampled and is processed in blocks of N samples. Previously transformed inputs X$_m$(k) are stored in the storage buffers 8010-8025. The transformed contents of the input storage buffers 8010-8025 are multiplied using respective multipliers 8160-8175, by respective coefficients B'$_m$(k) which are stored in respective registers 8055-8070. The multiplication results are summed in a summer 8150, and then the result is stored in a register 8190.

Thereafter, the X$_m$(k) output storage buffers 8010-8025 are shifted one place down. The input shifting operation is as follows:

X$_{-3}$(k) in register 8025 is discarded

X$_{-2}$(k) in storage buffer 8020 is placed in X$_{-3}$(k) storage buffer 8025

X$_{-1}$(k) in storage buffer 8015 is placed in X$_{-2}$(k) storage buffer 8020

X$_{-0}$(k) in storage buffer 8010 is placed in X$_{-1}$(k) storage buffer 8015.

The shifting operation need not comprise a copying of data and preferably the position of data in the first storage buffer in relation to data in the rest of the storage buffers is modified to avoid any copying of data. The N input samples x(n) in the register 8000 are appended with N zeros and transformed via an MDFT operation 8005 to create N complex frequency samples which are then placed in the X$_0$(k) storage register 8010. The N new complex frequency input samples X$_0$(k) in the register 8010 are then multiplied using a multiplier 8155 with coefficients H'$_1$(k) from the register 8050. The multiplication output thereof is then summed in a summer 8125 together with the value in the register 8190. The output of the summer 8125 is then transformed via an Inverse MDFT operation 8130. The first N samples of the resultant are kept and placed in a y(n) output storage buffer 8135, these samples being the desired output. The aforementioned procedure then continues for each block of N inputs of x(n) stored in the register 8000, thereby creating N outputs of y(n) stored in register 8135.

Figure 9:
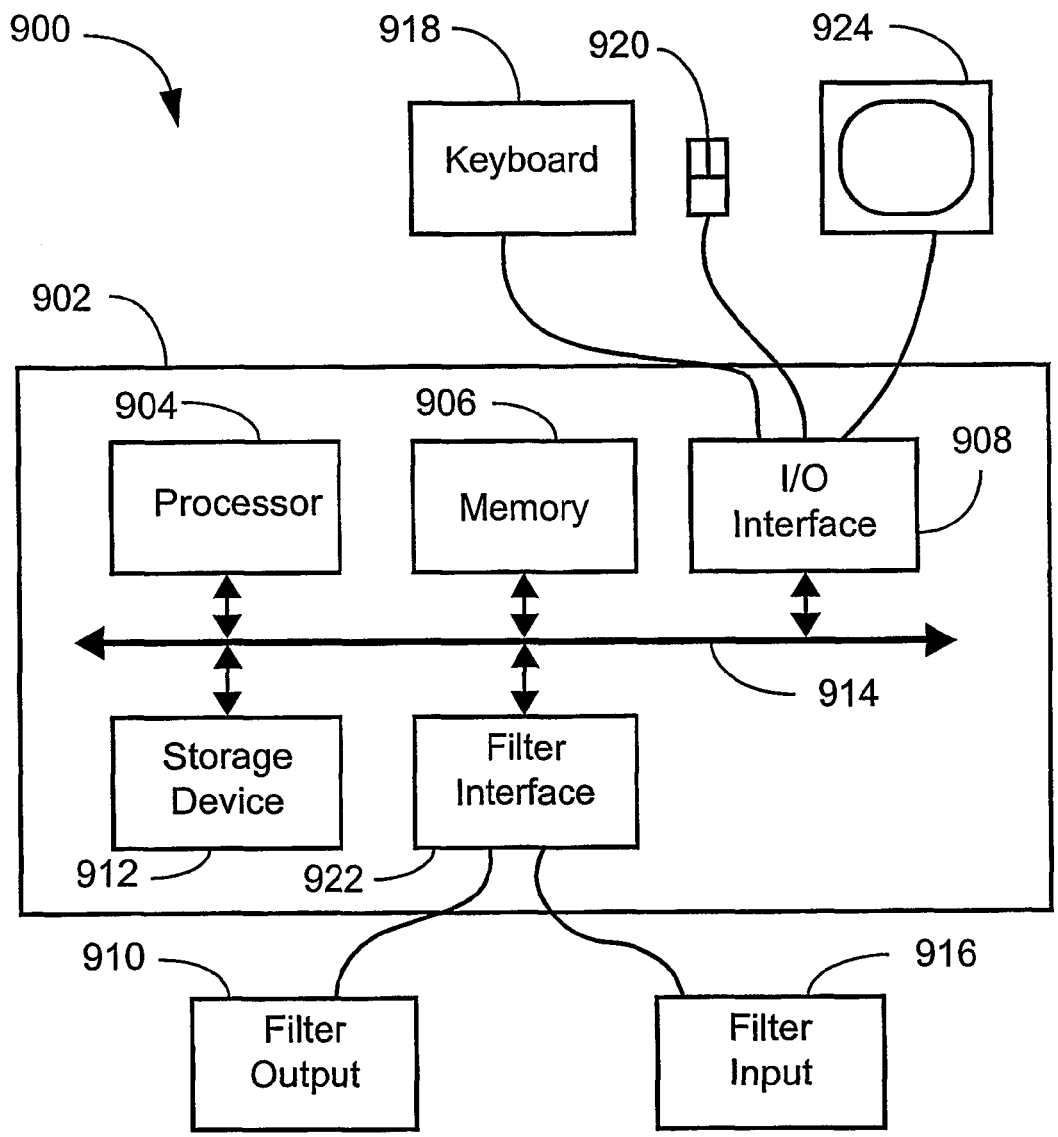
FIG. 9 illustrates how the described arrangements can be practiced using a general-purpose computer.

The aforementioned arrangements can be implemented using a general-purpose computer 900 as illustrated in FIG. 9. The various processes described are implemented as software executing on the computer 900. In particular, the various process steps are effected by instructions in the software that are carried out by the computer 900. The software can be stored in a computer readable medium, is loaded onto the computer 900 from the medium, and then executed by the computer 900. The use of the computer program product in the computer preferably implements a high order filter with desired attributes and performance. The computer system 900 includes a computer module 902, a filter input card 916, and input devices keyboard 918 and pointing device 920. In addition, the computer system 900 can have any of a number of other output devices including a display 924. The computer system 900 is connected to one or more other computers using an appropriate communication channel such as a modem communications path, a computer network, or the like. The computer network can include a local area network (LAN), a wide area network (WAN), an Intranet, and/or Internet. Thus, for example, signals are input via filter input card 916, control commands are input via keyboard 918, and the desired signal having been processed by the desired high order filter is output via filter output card 910. The computer 902 itself includes at least one central processing unit 904 (simply referred to as a processor hereinafter), a memory 906 which can include random access memory (RAM) and read-only memory (ROM), an input/output (IO) interface 908, a filter input interface 922, and one or more storage devices generally represented by a block 912. The storage device(s) 912 can include one or more of the following: a floppy disk, a hard disk drive, a magneto-optical disk drive, CD-ROM, magnetic tape or any other of a number of non-volatile storage devices well known to those skilled in the art. Each of the components 904, 906, 908, 912 and 922, is typically connected to one or more of the other devices via a bus 914 that in turn can include data, address, and control buses. The filter interface 922 is connected to the filter input 916 and filter output 910 cards, and provides input from the filter input card 916 to the computer 902 and from the computer 902 to the filter output card 910.

The described arrangements can, alternatively, be implemented on one or more integrated circuits. This mode of implementation allows incorporation of the filters into individual pieces of equipment where the functionality provided by such filters is required.

The foregoing describes only some particular embodiments of the present invention, and modifications can be made thereto without departing from the scope of the invention, the embodiments being illustrative and not restrictive.

APPENDIX

```
function y=iirfft2(b,a,x,N)
% IIRFFT2 IIR fast convolution filter algorithm no. 2
%       1. y = IIRFFT2( b , a , x , N, bits, fixed, dither)
%
%       IIRFFT2 processes the difference equation given by
%
%           a(1)*y(n) = b(1)*x(n) + b(2)*x(n-1) + ... + b(nb+1)*x(n-nb)
%                             - a(2)*y(n-1) - ... - a(na+1)*y(n-na)
%
%       where the response to an input x(n) is given by the following
%       equation.
%                   B(z)         1
%           Y(z) = ---- X(z) + --- ( G(z)-F(z) )
%                   A(z)        A(z)
%
%       and F(z) = initial conditions of output sequence
%           G(z) = initial conditions of input sequence.
%
%                   na-n-1                nb-n-1
%           f(n) = sum   a(n+r+1).y(-1-r), g(n) = sum   b(n+r+1).x(-1-r)
%                   r=0                    r=0
%
%       To calculate N outputs we need the first N initial conditions, the
%       first N samples of B(z)/A(z), and the first N samples of 1/A(z).
%
%       Let:
%           H1(z) = z-transform first N samples of inverse z-transform B(z)/A(z)
%           H2(z) = z-transform first N samples of inverse z-transform 1/A(z)
%           M     = max(na,nb)/N
%
%       The equations above give a method for processing the IIR in the
%       frequency domain.
%
%           Y(z) = H1(z).X(z) + H2(z).(G(z)-F(z))
%
%       To calculate F(z) & G(z) the cofficients are partitioned in to M x N
%       point sections.
%
% Copyright (C) Clarity EQ Pty Limited. All rights reserved.
error(nargchk(3,4,nargin));
if a(1)==0
       error('First term a(1) cannot equal zero');
end
% Make all column vectors
[r,c]=size(x);
x=x(:);
b=b(:);
a=a(:);
na=length(a);
nb=length(b);
nx=length(x);
nab=max([na nb]);
if nargin==3|isempty(N)
    N=2^nextpow2(ceil((nab-1)/4));
end
N=2^nextpow2(N);       % overlap/partion size, FFT size = 2.N
M=ceil(nab/N);         % no. of partitions for this filter
K=ceil(nx/N);          % no. of iterations required for output
if N>nab
    error('Block size greater than order of IIR'); % use IIRFFT when N>=nab
end
% Setup time < 0 initial conditions
y=zeros((K+1)*N+nab,1);
x=[zeros(nab,1);x;zeros((K+1)*N-nx, 1)];
% Create FIRs in Freq domain
% EQUATION 24
H1=fft(filter(b(1:min(nb,N)),a(1:min(na,N)),[1;zeros(N-1,1)]),2*N);
H2=fft(filter(1,a(1:min(na,N)),[1;zeros(N-1,1)]),2*N);
% Initialise block shift buffer for I/O
Ybuf=zeros(2*N,M);
Xbuf=zeros(2*N,M);
% Partition a(n) and b(n) to create a'==aa and b'==bb
```

APPENDIX-continued

```
aa=[0;a(2:na);zeros((M+1)*N-na,1)];
bb=[0;b(2:nb);zeros((M+1)*N-nb,1)];
Abuf=zeros(2*N,M);
Bbuf=zeros(2*N,M);
for k=1:M
    Abuf(:,k)=fft(aa(1+(k-1)*N:(k+1)*N),2*N);
    Bbuf(:,k)=fft(bb(1+(k-1)*N:(k+1)*N),2*N);
end
% Iterate K times - until all x(n) processed
for i=1:K
    % Each iteration is a calculation of N output samples
    % given na-1&nb-1 initial conditions
    n=(i-1)*N + nab + 1; % Current zero time index - ith block (5000 in fig 5)
    % Calc coefficients f(n) and g(n)
    FF=sum(Ybuf.*Abuf,2);          %% EQUATION 17: output of summer 5095 fig 5
    GG=sum(Xbuf.*Bbuf,2);          %% EQUATION 18: output of summer 5150 fig 5
    tmp=real(ifft(GG-FF));         %% GG-FF: output of summer 5096 in fig 5
    G_F=fft(tmp(N+1:2*N),2*N);     %% G-F:   5110 in fig 5
    % Shift input buffer and add new entry
    Xbuf(:,2:M)=Xbuf(:,1:M-1);
    Xbuf(:,1)=fft(x(n:n+N-1),2*N);
    tmp=real(ifft(H1.*Xbuf(:,1)+H2.*G_F)); %% EQUATION 15: 5125 and 5130 in fig 5.
    y(n:n+N-1)=tmp(1:N);           %% 5135 in fig 5
    % Shift output buffer and add new I/O entry
    Ybuf(:,2:M)=Ybuf(:,1:M-1);
    Ybuf(:,1)=fft(y(n:n+N-1),2*N);
end
% Get output vector and remove delay
y=y(nab+1:nab+nx);
if r==1
    y=y.';
end.
```

The invention claimed is:

1. A method of digitally filtering an input electronic signal to thereby implement a digital filter, said method being performed by a processor and comprising, for a current block of filter input signal values obtained from the input signal, the steps of:
    calculating a partial filter input initial condition, using a partitioned filter input signal, and partitioned filter input coefficients;
    calculating a partial filter output initial condition, using a partitioned filter output signal, and partitioned filter output coeffcients; and
    calculating an output of said digital filter as a sum of outputs of filter elements, wherein inputs of said filter elements are dependent upon said partial filter input initial condition, said partial filter output initial condition, and said current block of filter input signal values.

2. The method according to claim 1, wherein the step of calculating a partial filter input initial condition comprises the sub-steps of:
    calculating first partitioning of filter input signals to form a first partitioned data set;
    calculating second partitioning of filter input coefficients to form a second partitioned data set; and
    calculating a convolution of said first and said second data sets by the sub-steps of:
        (i) applying a transform to each of said first and said second data sets to thereby form corresponding first and second transformed data sets;
        (ii) performing, on said corresponding first and second transformed data sets, a transform operation which is equivalent to convolution in the time domain, to thereby form a third data set; and
        (iii) applying a corresponding inverse transform to said third data set, to thereby determine said partial filter input initial condition.

3. The method according to claim 1, wherein said step of calculating a partial filter output initial condition comprises the sub-steps of:
    calculating first partitioning of filter output signals to form a first partitioned data set;
    calculating second partitioning of filter output coefficients to form a second partitioned data set; and
    calculating a convolution of said first and said second data sets by the sub-steps of:
        (i) applying a transform to each of said first and said second data sets to thereby form corresponding first and second transformed data sets;
        (ii) performing, on said corresponding first and second transformed data sets, a transform operation which is equivalent to convolution in the time domain, to thereby form a third data set; and
        (iii) applying a corresponding inverse transform to said third data set, to thereby determine said partial filter output initial condition.

4. The method according to anyone of claims 1 to 3, wherein a size of the partition is equal to a size of the current block.

5. The method according to anyone of claims 1 to 3, wherein a size of the partition is dependent upon one of a required filter latency and a required filter computational efficiency.

6. The method according to anyone of claims 1 to 3, wherein said digital filter is one of a Finite Impulse Response filter, an Infinite Impulse Response Filter, and an All Pole Filter.

7. A digital filter for filtering an input electronic signal said filter comprising:
    first computational means for calculating a partial filter input initial condition, using a partitioned filter input signal, and partitioned filter input coefficients;

second computational means for calculating a partial filter output initial condition, using a partitioned filter output signal, and partitioned filter output coeffcients; and third computational means for calculating an output of said digital filter as a sum of outputs of filter elements, wherein inputs of said filter elements are dependent upon said partial filter input initial condition, said partial filter output initial condition, and said current block of filter input signal values.

8. The digital filter according to claim 7, wherein said first computational means comprises:
first partitioning means for calculating partitioning of filter input signals to form a first partitioned data set;
second partitioning means for calculating partitioning of filter input coefficients to form a second partitioned data set; and
convolving means for calculating a convolution of said first and said second data sets by the sub-steps of:
(i) applying a transform to each of said first and said second data sets to thereby form corresponding fist and second transformed data sets;
(ii) performing, on said corresponding first and second transformed data sets, a transform operation which is equivalent to convolution in the time domain, to thereby form a third data set; and
(iii) applying a corresponding inverse transform to said third data set, to thereby determine said partial filter input initial condition.

9. The digital filter according to claim 7, wherein said second computational means comprises:
first partitioning means for calculating partitioning of filter output signals to form a fist partitioned data set;
second partitioning means for calculating partitioning of filter output coefficients to form a second partitioned data set; and
convolving means for calculating a convolution of said first and said second data sets by the sub-steps of:
(i) applying a transform to each of said first and said second data sets to thereby form corresponding first and second transformed data sets;
(ii) performing, on said corresponding first and second transformed data sets, a transform operation which is equivalent to convolution in the time domain, to thereby form a third data set; and
(iii) applying a corresponding inverse transform to said third data set, to thereby determine said partial filter output initial condition.

10. The digital filter according to anyone of claims 7 to 9, wherein a size of the partition is equal to a size of the current block.

11. The digital filter according to any one of claims 7 to 9, wherein a size of the partition is dependent upon one of a required filter latency and a required filter computational efficiency.

12. The digital filter according to anyone of claims 7 to 9, wherein said digital filter is one of a Finite Impulse Response filter, an Infinite Impulse Response Filter, and an All Pole Filter.

13. An electronic system using a digital filter for processing an input electronic signal, wherein said digital filter comprises:
first computational means for calculating a partial filter input initial condition, using a partitioned filter input signal, and partitioned filter input coeffcients;
second computational means for calculating a partial filter output initial condition, using a partitioned filter output signal, and partitioned filter output coeffcients; and
third computational means for calculating an output of said digital filter as a sum of outputs of filter elements, wherein inputs of said filter elements are dependent upon said partial filter input initial condition, said partial filter output initial condition, and said current block of filter input signal values.

14. The system according to claim 13, wherein said first computational means comprise:
first partitioning means for calculating partitioning of filter input signals to form a first partitioned data set;
second partitioning means for calculating partitioning of filter input coefficients to form a second partitioned data set; and
convolving means for calculating a convolution of said first and said second data sets by the sub-steps of:
(i) applying a transform to each of said first and said second data sets to thereby form corresponding first and second transformed data sets;
(ii) performing, on said corresponding first and second transformed data sets, a transform operation which is equivalent to convolution in the time domain, to thereby form a third data set; and
(iii) applying a corresponding inverse transform to said third data set, to thereby determine said partial filter input initial condition.

15. The system according to claim 13, wherein said second computational means comprises:
first partitioning means for calculating partitioning of filter output signals to form a first partitioned data set;
second partitioning means for calculating partitioning of filter output coefficients to form a second partitioned data set; and
convolving means for calculating a convolution of said first and said second data sets by the sub-steps of:
(i) applying a transform to each of said first and said second data sets to thereby form corresponding first and second transformed data sets;
(ii) performing, on said corresponding first and second transformed data sets, a transform operation which is equivalent to convolution in the time domain, to thereby form a third data set; and
(iii) applying a corresponding inverse transform to said third data set, to thereby determine said partial filter output initial condition.

16. The system according to anyone of claims 13 to 15, wherein a size of the partition is equal to a size of the current block.

17. The system according to anyone of claims 13 to 15, wherein a size of the partition is dependent upon one of a required filter latency and a required filter computational efficiency.

18. The system according to anyone of claims 13 to 15, wherein said digital filter is one of a Finite Impulse Response filter, an Infinite Impulse Response Filter, and an All Pole Filter.

19. A computer readable memory medium storing a computer program for an electronic apparatus implementing a digital filter for filtering an input electronic signal, said program comprising:
first code for calculating of a partial filter input initial condition, using a partitioned filter input signal, and partitioned filter input coefficients;
second code for calculating of a partial filter output initial condition, using a partitioned filter output signal, and partitioned filter output coefficients; and
code for calculating an output of said digital filter as a sum of outputs of filter elements, wherein inputs of said filter elements are dependent upon said partial filter input initial condition, said partial filter output initial condition, and said current block of filter input signal values.

20. The computer readable memory medium according to claim 19, wherein said first code comprises:
    first code for calculating partitioning of filter input signals to form a first partitioned data set;
    second code for calculating partitioning of filter input coefficients to form a second partitioned data set; and
    code for calculating a convolution of said first and said second data sets by the sub-steps of:
        (i) applying a transform to each of said first and said second data sets to thereby form corresponding first and second transformed data sets;
        (ii) performing, on said corresponding first and second transformed data sets, a transform operation which is equivalent to convolution in the time domain, to thereby form a third data set; and
        (iii) applying a corresponding inverse transform to said third data set, to thereby determine said partial filter input initial condition.

21. The computer readable memory medium according to claim 19, wherein said second code comprises:
    first code for calculating partitioning of filter output signals to form a first partitioned data set;
    second code for calculating partitioning of filter output coeffcients to form a second partitioned data set; and
    code for calculating a convolution of said first and said second data sets by the sub-steps of:
        (i) applying a transform to each of said first and said second data sets to thereby form corresponding first and second transformed data sets;
        (ii) performing, on said corresponding first and second transformed data sets, a transform operation which is equivalent to convolution in the time domain, to thereby form a third data set; and
        (iii) applying a corresponding inverse transform to said third data set, to thereby determine said partial filter output initial condition.

22. The computer readable memory medium according to anyone of claims 19 to 21, wherein a size of the partition is equal to a size of the current block.

23. The computer readable memory medium according to anyone of claims 19 to 21, wherein a size of the partition is dependent upon one of a required filter latency and a required filter computational efficiency.

24. The computer readable memory medium according to anyone of claims 19 to 21, wherein said digital filter is one of a Finite Impulse Response filter, an Infinite Impulse Response Filter, and an All Pole Filter.

* * * * *

UNITED STATES PATENT AND TRADEMARK OFFICE
CERTIFICATE OF CORRECTION

| | | |
|---|---|---|
| PATENT NO. | : 7,333,539 B2 | |
| APPLICATION NO. | : 10/275508 | |
| DATED | : February 19, 2008 | |
| INVENTOR(S) | : Paul W. Glendenning | |

It is certified that error appears in the above-identified patent and that said Letters Patent is hereby corrected as shown below:

In column 18, in claim 4, line 1, after "according to" delete "anyone" and substitute --any one-- in its place.

In column 18, in claim 5, line 1, after "according to" delete "anyone" and substitute --any one-- in its place.

In column 18, in claim 6, line 1, after "according to" delete "anyone" and substitute --any one-- in its place.

In column 19, in claim 8, line 11, after "corresponding" delete "fist" and substitute --first-- in its place.

In column 19, in claim 9, line 4, before "partitioned data" delete "fist" and substitute --first-- in its place.

In column 19, in claim 10, line 1, after "according to" delete "anyone" and substitute --any one-- in its place.

In column 19, in claim 12, line 1, after "according to" delete "anyone" and substitute --any one-- in its place.

In column 20, in claim 16, line 1, after "according to" delete "anyone" and substitute --any one-- in its place.

In column 20, in claim 17, line 1, after "according to" delete "anyone" and substitute --any one-- in its place.

In column 20, in claim 18, line 1, after "according to" delete "anyone" and substitute --any one-- in its place.

In column 20, in claim 19, line 5, after "for calculating" delete "of".

In column 20, in claim 19, line 8, after "for calculating" delete "of".

UNITED STATES PATENT AND TRADEMARK OFFICE
CERTIFICATE OF CORRECTION

PATENT NO.       : 7,333,539 B2
APPLICATION NO.  : 10/275508
DATED            : February 19, 2008
INVENTOR(S)      : Paul W. Glendenning It is certified that error appears in the above-identified patent and that said Letters Patent is hereby corrected as shown below:

In column 22, in claim 22, line 2, before "of claims 19" delete "anyone" and substitute --any one-- in its place.

In column 22, in claim 23, line 2, before "of claims 19" delete "anyone" and substitute --any one-- in its place.

In column 22, in claim 24, line 2, before "of claims 19" delete "anyone" and substitute --any one-- in its place.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,333,539 B2
APPLICATION NO. : 10/275508
DATED : February 19, 2008
INVENTOR(S) : Paul W. Glendenning It is certified that error appears in the above-identified patent and that said Letters Patent is hereby corrected as shown below:

In column 18, in claim 4, line 52, after "according to" delete "anyone" and substitute --any one-- in its place.

In column 18, in claim 5, line 55, after "according to" delete "anyone" and substitute --any one-- in its place.

In column 18, in claim 6, line 59, after "according to" delete "anyone" and substitute --any one-- in its place.

In column 19, in claim 8, line 20, after "corresponding" delete "fist" and substitute --first-- in its place.

In column 19, in claim 9, line 32, before "partitioned data" delete "fist" and substitute --first-- in its place.

In column 19, in claim 10, line 48, after "according to" delete "anyone" and substitute --any one-- in its place.

In column 19, in claim 12, line 55, after "according to" delete "anyone" and substitute --any one-- in its place.

In column 20, in claim 16, line 45, after "according to" delete "anyone" and substitute --any one-- in its place.

In column 20, in claim 17, line 48, after "according to" delete "anyone" and substitute --any one-- in its place.

In column 20, in claim 18, line 52, after "according to" delete "anyone" and substitute --any one-- in its place.

In column 20, in claim 19, line 60, after "for calculating" delete "of".

In column 20, in claim 19, line 63, after "for calculating" delete "of".

UNITED STATES PATENT AND TRADEMARK OFFICE
CERTIFICATE OF CORRECTION

PATENT NO. : 7,333,539 B2  
APPLICATION NO. : 10/275508  
DATED : February 19, 2008  
INVENTOR(S) : Paul W. Glendenning It is certified that error appears in the above-identified patent and that said Letters Patent is hereby corrected as shown below:

In column 22, in claim 22, line 16, before "of claims 19" delete "anyone" and substitute --any one-- in its place.

In column 22, in claim 23, line 19, before "of claims 19" delete "anyone" and substitute --any one-- in its place.

In column 22, in claim 24, line 24, before "of claims 19" delete "anyone" and substitute --any one-- in its place.

This certificate supersedes the Certificate of Correction issued September 23, 2008.

Signed and Sealed this

Fourteenth Day of October, 2008

JON W. DUDAS  
*Director of the United States Patent and Trademark Office*